(12) United States Patent
Hazama et al.

(10) Patent No.: US 11,479,647 B2
(45) Date of Patent: Oct. 25, 2022

(54) FILM INCLUDING A FLUOROPOLYMER

(71) Applicant: DAIKIN INDUSTRIES, LTD., Osaka (JP)

(72) Inventors: Takeshi Hazama, Osaka (JP); Nobuyuki Komatsu, Osaka (JP); Kouji Yokotani, Osaka (JP); Mayuko Tatemichi, Osaka (JP); Tatsuya Higuchi, Osaka (JP); Keiko Koga, Osaka (JP)

(73) Assignee: DAIKIN INDUSTRIES. LTD., Osaka (JP)

( * ) Notice: Subject to any disclaimer, the term of this patent is extended or adjusted under 35 U.S.C. 154(b) by 820 days.

(21) Appl. No.: 16/337,186

(22) PCT Filed: Sep. 27, 2017

(86) PCT No.: PCT/JP2017/034911
§ 371 (c)(1),
(2) Date: Mar. 27, 2019

(87) PCT Pub. No.: WO2018/062253
PCT Pub. Date: Apr. 5, 2018

(65) Prior Publication Data
US 2020/0032014 A1 Jan. 30, 2020

(30) Foreign Application Priority Data

Sep. 28, 2016 (JP) .............................. JP2016-190144

(51) Int. Cl.
*C08J 5/18* (2006.01)
*B32B 15/08* (2006.01)
*G02B 26/00* (2006.01)
*H01B 3/44* (2006.01)
*H01G 4/18* (2006.01)
*H01G 4/33* (2006.01)
*H01L 41/08* (2006.01)
*H01L 41/193* (2006.01)
*H01G 4/32* (2006.01)
*C08L 27/16* (2006.01)
*H01B 5/16* (2006.01)

(52) U.S. Cl.
CPC ................ *C08J 5/18* (2013.01); *B32B 15/08* (2013.01); *G02B 26/005* (2013.01); *H01B 3/44* (2013.01); *H01G 4/18* (2013.01); *H01G 4/186* (2013.01); *H01G 4/33* (2013.01); *H01L 41/0805* (2013.01); *H01L 41/193* (2013.01); *B32B 2307/20* (2013.01); *B32B 2307/204* (2013.01); *B32B 2307/704* (2013.01); *B32B 2457/16* (2013.01); *C08J 2327/16* (2013.01); *C08J 2327/18* (2013.01)

(58) Field of Classification Search
None
See application file for complete search history.

(56) References Cited

U.S. PATENT DOCUMENTS

2010/0110609 A1  5/2010  Koh et al.
2013/0188293 A1  7/2013  Koh et al.

FOREIGN PATENT DOCUMENTS

| CA | 1289313 C | * | 9/1991 |
|---|---|---|---|
| EP | 2 674 804 A1 | | 12/2013 |
| EP | 3 327 068 A1 | | 5/2018 |
| JP | 60-199046 A | | 10/1985 |
| WO | 2008/090947 A1 | | 7/2008 |
| WO | 2012/039424 A1 | | 3/2012 |

OTHER PUBLICATIONS

International Search Report for PCT/JP2017/034911 dated Dec. 26, 2017 [PCT/ISA/210].
International Preliminary Report on Patentability with translation of the Written Opinion dated April 2, 2019 in International Application No. PCT/JP2017/034911.
Yadav et al., "The Effect of Frequency and Temperature on Dielectric Properties of Pure Poly Vinylidene Fluoride (PVDF) Thin Films", Proceedings of the International Multiconference of Engineers and Computer Scientists, vol. III, Jan. 1, 2010, XP002788578, 4 pages.
Supplementary European Search Report for counterpart EP Appln. No. 17856202.1 dated Apr. 8, 2020.

* cited by examiner

*Primary Examiner* — Ramsey Zacharia
(74) *Attorney, Agent, or Firm* — Sughrue Mion, PLLC

(57) ABSTRACT

The invention provides a film having a high relative permittivity, a high volume resistivity, and a high breakdown strength. The film has a relative permittivity of 9 or higher at a frequency of 1 kHz and 30° C., a volume resistivity of 5E+15 Ω·cm or higher at 30° C., and a breakdown strength of 500 V/μm or higher.

7 Claims, No Drawings

FILM INCLUDING A FLUOROPOLYMER

CROSS REFERENCE TO RELATED APPLICATIONS

This application is a National Stage of International Application No. PCT/JP2017/034911 filed Sep. 27, 2017, claiming priority based on Japanese Patent Application No. 2016-190144 filed Sep. 28, 2016.

TECHNICAL FIELD

The invention relates to films.

BACKGROUND ART

Films of a vinylidene fluoride homopolymer and films of a copolymer of vinylidene fluoride and another monomer are known to have a high relative permittivity.

Patent Literature 1, for example, discloses a film having excellent dielectric characteristics. This film can be formed from a vinylidene fluoride resin composition containing 95 to 30% by weight of a vinylidene fluoride resin and 5 to 70% by weight of polyether.

Patent Literature 2 discloses a highly dielectric film formed from a fluororesin containing a total of 95 mol % or more of a vinylidene fluoride unit and a tetrafluoroethylene unit.

Patent Literature 3 discloses a film for film capacitors, wherein the film contains, as a film-forming resin, tetrafluoroethylene resin containing a vinylidene fluoride unit and a tetrafluoroethylene unit at a mol % ratio in the range from 0/100 to 49/51 (vinylidene fluoride unit/tetrafluoroethylene unit).

CITATION LIST

Patent Literatures

Patent Literature 1: JP S60-199046 A
Patent Literature 2: WO 2008/090947
Patent Literature 3: WO 2012/039424

SUMMARY OF INVENTION

Technical Problem

Nevertheless, there is still a demand for films having a higher relative permittivity than conventional films and also having a high volume resistivity and a high breakdown strength.

Combining highly dielectric materials is a method to increase the relative permittivity, but a material having a high relative permittivity adsorbs a large amount of moisture, reducing the volume resistivity. Further, a difference in relative permittivity between the primary polymer material and an additive causes a reduction in breakdown strength. This leads to a demand for a method capable of satisfying all of a high permittivity, a high volume resistivity, and a high breakdown strength.

In view of the above current state of the art, the invention aims to provide a film having all of a high relative permittivity, a high volume resistivity, and a high breakdown strength.

Solution to Problem

The invention relates to a film having: a relative permittivity of 9 or higher at a frequency of 1 kHz and 30° C.; a volume resistivity of 5E+15 Ω·cm or higher at 30° C.; and a breakdown strength of 500 V/μm or higher.

The film preferably has a crystallinity of 60% or higher.
The film preferably has a half width of a crystal peak of 0.5 to 1.5 in X-ray diffraction.
The film preferably contains a polymer.
The film preferably contains a fluoropolymer having a melting point of 180° C. or higher.
The film preferably contains a fluoropolymer containing a vinylidene fluoride unit.
The film preferably has a thickness of 1 to 100 μm.
The film is preferably a highly dielectric film or a piezoelectric film.
The film can suitably be used in a film capacitor, an electrowetting device, or a piezoelectric panel.

Advantageous Effects of Invention

The film of the invention, which has any of the above structures, has a high relative permittivity, a high volume resistivity, and a high breakdown strength.

DESCRIPTION OF EMBODIMENTS

The invention is described in detail below.

The film of the invention has a relative permittivity of 9 or higher at a frequency of 1 kHz and 30° C.

The relative permittivity is preferably 10 or higher.

The relative permittivity is a value calculated from the following formula: $C=\varepsilon \times \varepsilon_0 \times S/d$, wherein C is the capacitance measured with an LCR meter, the sample being prepared by depositing aluminum with a diameter of 50 mm on a surface of the film and depositing aluminum on the whole opposite surface; S is the electrode area; d is the film thickness; and $\varepsilon_0$ is the permittivity of vacuum.

The film of the invention has a volume resistivity of 5E+15 Ω·cm or higher, preferably 6E+15 Ω·cm or higher, more preferably 7E+15 Ω·cm or higher, still more preferably 8E+15 Ω·cm or higher, particularly preferably 9E+15 Ω·cm or higher, at 30° C. The volume resistivity is most preferably 1E+16 Ω·cm or higher. The upper limit of the volume resistivity may be 1E+17 Ω·cm, or may be 5E+17 Ω·cm.

The volume resistivity is measured as follows. First, aluminum is deposited on one surface of the film in vacuo to prepare a sample. Next, this sample is placed in a constant temperature chamber (30° C., 25% RH) and a voltage of 50 V/μm is applied to the sample using a digital super megohmmeter/microammeter, whereby the volume resistivity (Ω·cm) is measured.

The film of the invention has a breakdown strength of 500 V/μm or higher, preferably 550 V/μm or higher, more preferably 600 V/μm or higher. The breakdown strength may be 1000 V/μm or lower, or may be 800 V/μm or lower.

The breakdown strength is determined as follows. The film is placed on a lower electrode and a 500-g weight having a diameter of 25 mm is placed thereon as an upper electrode. A voltage applied between the ends is increased at a rate of 100 V/sec, and the voltage at break is measured. The number of measurement operations is 50. The measured values of the respective operations, excluding the five highest values and the five lowest values, are averaged. This average is divided by the thickness, whereby the breakdown voltage is obtained.

The film of the invention satisfies the above structures, and thus has a high relative permittivity, a high volume resistivity, and a high breakdown strength. In actual use, a capacitor is exposed to an electric field as high as 150 V/μm or higher, for example. The film of the invention can exhibit excellent durability and insulation, as well as a high capacitor capacity and a sufficient volume resistivity for the use as a capacitor even in a high electric field region of 150 V/μm or higher.

The film of the invention preferably has a crystallinity of 60% or higher, more preferably 70% or higher, still more preferably 80% or higher.

The crystallinity is determined as follows. A plurality of the films is mounted on a sample holder to prepare a measurement sample. The sample is analyzed within the range of 10° to 40° using an X-ray diffractometer, so that a diffraction spectrum is obtained. The crystallinity is calculated from the area ratio of the crystal portions and the amorphous portions in the diffraction spectrum. For the film having a thickness of smaller than 40 μm, a plurality of the films are stacked so as to give a total thickness of 40 μm or greater.

The film of the invention preferably has a half width of the crystal peak of 0.5 to 1.5 in the X-ray diffraction.

The half width is determined as follows. The peak in the spectrum obtained with the X-ray diffractometer is resolved into the crystal peak and the amorphous halo by peak separation. With the height from the background of the resulting crystal peak to the peak top defined as h, the half width is determined from the width of the crystal peak at the portion corresponding to h/2.

The film of the invention preferably has a thickness of 100 μm or smaller, more preferably 30 μm or smaller, still more preferably 10 μm or smaller. The thickness may be 1 μm or greater.

The thickness can be measured with a digital thickness meter. The thickness commonly used is 2 μm or greater and 8 μm or smaller or 2 μm or greater and 5 μm or smaller.

The film of the invention preferably contains a polymer, more preferably a fluoropolymer. The film of the invention may be an organic film.

Examples of the organic film include those containing any of polymers such as polyolefin polymers, polycycloolefin polymers, polyester polymers, polyamide polymers, polylactic acid polymers, polyimide polymers, polyether imide polymers, urethane polymers, and epoxy polymers.

Examples of the fluoropolymer include polytetrafluoroethylene, tetrafluoroethylene/ethylene copolymers, polyvinylidene fluoride, tetrafluoroethylene/perfluoroalkyl vinyl ether copolymers, and tetrafluoroethylene/hexafluoropropylene copolymers. Preferred are fluoropolymers containing a vinylidene fluoride unit because they have better heat resistance and higher dielectricity. More preferred are vinylidene fluoride/tetrafluoroethylene copolymers, vinylidene fluoride/trifluoroethylene copolymers, vinylidene fluoride/hexafluoropropylene copolymers, and vinylidene fluoride/tetrafluoroethylene/hexafluoropropylene copolymers.

The fluoropolymer preferably has a melting point of 180° C. or higher. The upper limit thereof may be 320° C. A more preferred lower limit is 190° C., and a more preferred upper limit is 280° C.

The fluoropolymer is more preferably a vinylidene fluoride/tetrafluoroethylene copolymer.

In order to achieve better heat resistance and a smaller difference between the permittivity at low temperatures and the permittivity at high temperatures, the copolymer preferably has a mole ratio of the vinylidene fluoride unit to the tetrafluoroethylene unit of 5/95 to 95/5, more preferably 10/90 to 90/10, still more preferably 10/90 to 49/51, further more preferably 20/80 or more and 45/55 or less.

The copolymer preferably further contains a copolymerized unit of an ethylenically unsaturated monomer (excluding tetrafluoroethylene and vinylidene fluoride).

The proportion of the copolymerized unit of an ethylenically unsaturated monomer may be 0 to 50 mol %, 0 to 40 mol %, 0 to 30 mol %, 0 to 15 mol %, or 0 to 5 mol %, of all the copolymerized units.

The ethylenically unsaturated monomer may be any monomer copolymerizable with tetrafluoroethylene and vinylidene fluoride, and is preferably at least one selected from the group consisting of ethylenically unsaturated monomers represented by the following formulae (1) and (2).

The formula (1) is as follows:

$$CX^1X^2=CX^3(CF_2)_nX^4 \quad (1)$$

wherein $X^1$, $X^2$, $X^3$, and $X^4$ are the same as or different from each other, and are each H, F, or Cl; and n is an integer of 0 to 8, excluding tetrafluoroethylene and vinylidene fluoride.

The formula (2) is as follows:

$$CF_2=CF-ORf^1 \quad (2)$$

wherein $Rf^1$ is a C1-C3 alkyl group or a C1-C3 fluoroalkyl group.

Preferred among the ethylenically unsaturated monomers represented by the formula (1) is at least one selected from the group consisting of $CF_2=CFCl$, $CF_2=CFCF_3$, those represented by the following formula (3):

$$CH_2=CF-(CF_2)_nX^4 \quad (3)$$

wherein $X^4$ and n are as defined above, and those represented by the following formula (4):

$$-CH_2-CH-(CF_2)_nX^4 \quad (4)$$

wherein $X^4$ and n are as defined above. More preferred is at least one selected from the group consisting of $CF_2=CFCl$, $CH_2=CFCF_3$, $CH_2=CH-C_4F_9$, $CH_2=CH-C_6F_{23}$, $CH_2=CF-C_3F_6H$, and $CF_2=CFCF_3$. Still more preferred is at least one selected from the group consisting of $CF_2=CFCl$, $CH_2=CH-C_6F_{13}$, and $CH_2=CFCF_3$.

Preferred among the ethylenically unsaturated monomers represented by the formula (2) is at least one selected from the group consisting of $CF_2=CF-OCF_3$, $CF_2=CF-OCF_2CF_3$, and $CF_2=CF-OCF_2CF_2CF_3$.

The copolymer is preferably a copolymer containing
55.0 to 90.0 mol % of a copolymerized unit of tetrafluoroethylene,
5.0 to 44.9 mol % of a copolymerized unit of vinylidene fluoride, and
0.1 to 10.0 mol % of a copolymerized unit of an ethylenically unsaturated monomer represented by the formula (1):

$$CX^1X^2=CX^3(CF_2)_nX^4 \quad (1)$$

wherein $X^1$, $X^2$, $X^3$, and $X^4$ are the same or different from each other, and are each H, F, or Cl; and n is an integer of 0 to 8, excluding tetrafluoroethylene and vinylidene fluoride.

The copolymer is more preferably a copolymer containing
55.0 to 85.0 mol % of a copolymerized unit of tetrafluoroethylene,
10.0 to 44.9 mol % of a copolymerized unit of vinylidene fluoride, and
0.1 to 5.0 mol % of a copolymerized unit of an ethylenically unsaturated monomer represented by the formula (1).

The copolymer is still more preferably a copolymer containing
55.0 to 85.0 mol % of a copolymerized unit of tetrafluoroethylene, 13.0 to 44.9 mol % of a copolymerized unit of vinylidene fluoride, and 0.1 to 2.0 mol % of a copolymerized unit of an ethylenically unsaturated monomer represented by the formula (1).

In order to improve the mechanical strength of the copolymer at high temperatures and low temperatures, the ethylenically unsaturated monomer represented by the formula (1) is preferably at least one monomer selected from the group consisting of $CH_2=CH-C_4F_9$, $CH_2=CH-C_6F_{13}$, and $CH_2=CF-C_3F_6H$. More preferably, the ethylenically unsaturated monomer represented by the formula (1) is at least one monomer selected from the group consisting of $CH_2=CH-C_4F_9$, $CH_2=CH-C_6F_{13}$, and $CH_2=CF-C_3F_6H$, and the copolymer is a copolymer containing 55.0 to 80.0 mol % of a copolymerized unit of tetrafluoroethylene, 19.5 to 44.9 mol % of a copolymerized unit of vinylidene fluoride, and 0.1 to 0.6 mol % of a copolymerized unit of the ethylenically unsaturated monomer represented by the formula (1).

The copolymer may be a copolymer containing 58.0 to 85.0 mol % of a copolymerized unit of tetrafluoroethylene, 10.0 to 41.9 mol % of a copolymerized unit of vinylidene fluoride, and 0.1 to 5.0 mol % of a copolymerized unit of an ethylenically unsaturated monomer represented by the formula (1).

The copolymer is also preferably a copolymer containing 55.0 to 90.0 mol % of a copolymerized unit of tetrafluoroethylene, 9.2 to 44.2 mol % of a copolymerized unit of vinylidene fluoride, and 0.1 to 0.8 mol % of a copolymerized unit of an ethylenically unsaturated monomer represented by the formula (2):

$$CF_2=CF-ORf^1 \qquad (2)$$

wherein $Rf^1$ is a C1-C3 alkyl group or a C1-C3 fluoroalkyl group.

The copolymer is more preferably a copolymer containing 58.0 to 85.0 mol % of a copolymerized unit of tetrafluoroethylene, 14.5 to 39.9 mol % of a copolymerized unit of vinylidene fluoride, and 0.1 to 0.5 mol % of a copolymerized unit of an ethylenically unsaturated monomer represented by the formula (2).

The copolymer is also preferably a copolymer containing 55.0 to 90.0 mol % of a copolymerized unit of tetrafluoroethylene, 5.0 to 44.8 mol % of a copolymerized unit of vinylidene fluoride, 0.1 to 10.0 mol % of a copolymerized unit of an ethylenically unsaturated monomer represented by the formula (1), and 0.1 to 0.8 mol % of a copolymerized unit of an ethylenically unsaturated monomer represented by the formula (2).

The copolymer is more preferably a copolymer containing 55.0 to 85.0 mol % of a copolymerized unit of tetrafluoroethylene, 9.5 to 44.8 mol % of a copolymerized unit of vinylidene fluoride, 0.1 to 5.0 mol % of a copolymerized unit of an ethylenically unsaturated monomer represented by the formula (1), and 0.1 to 0.5 mol % of a copolymerized unit of an ethylenically unsaturated monomer represented by the formula (2).

The copolymer is still more preferably a copolymer containing 55.0 to 80.0 mol % of a copolymerized unit of tetrafluoroethylene, 19.6 to 44.8 mol % of a copolymerized unit of vinylidene fluoride, 0.1 to 2.0 mol % of a copolymerized unit of an ethylenically unsaturated monomer represented by the formula (1), and 0.1 to 0.3 mol % of a copolymerized unit of an ethylenically unsaturated monomer represented by the formula (2). The copolymer having such a composition is particularly excellent in low permeability.

The copolymer may also be a copolymer containing 58.0 to 85.0 mol % of a copolymerized unit of tetrafluoroethylene, 9.5 to 39.8 mol % of a copolymerized unit of vinylidene fluoride, 0.1 to 5.0 mol % of a copolymerized unit of an ethylenically unsaturated monomer represented by the formula (1), and 0.1 to 0.5 mol % of a copolymerized unit of an ethylenically unsaturated monomer represented by the formula (2).

The copolymer preferably has a melt flow rate (MFR) of 0.1 to 100 g/10 min, more preferably 0.1 to 50 g/10 min.

The MFR is the mass (g/10 min) of a polymer that flows out of a nozzle (inner diameter: 2 mm, length: 8 mm) per 10 minutes at 297° C. and a 5-kg load in conformity with ASTM D3307-01.

The copolymer preferably has a melting point of 180° C. or higher. The upper limit thereof may be 290° C. A more preferred lower limit is 190° C., and a more preferred upper limit is 280° C.

The melting point is defined as the temperature corresponding to the peak on an endothermic curve obtained by thermal analysis at a temperature-increasing rate of 10° C./min using a differential scanning calorimeter in conformity with ASTM D-4591.

The copolymer preferably has a pyrolysis starting temperature (1% mass reduction temperature) of 360° C. or higher. A more preferred lower limit is 370° C. The upper limit of the pyrolysis starting temperature may be 410° C., for example, as long as it falls within the above range.

The pyrolysis starting temperature is the temperature at which 1% by mass of a copolymer subjected to a heating test is decomposed, and is a value obtainable by measuring the temperature at which the mass of the copolymer subjected to the heating test is reduced by 1% by mass, using a thermogravimetric/differential thermal analyzer (TG-DTA).

The copolymer preferably has a storage elastic modulus (E') at 170° C. of 60 to 400 MPa as measured by dynamic viscoelasticity analysis.

The storage elastic modulus is a value measured at 170° C. by dynamic viscoelasticity analysis. More specifically, the storage elastic modulus is a value measured on a sample having a length of 30 mm, width of 5 mm, and thickness of 0.25 mm, using a dynamic viscoelasticity analyzer in a tensile mode with a clamp width of 20 mm and at a measurement temperature of 25° C. to 250° C., a temperature-increasing rate of 2° C./min, and a frequency of 1 Hz. The storage elastic modulus (E') at 170° C. is more preferably 80 to 350 MPa, still more preferably 100 to 350 MPa.

Test samples may be prepared by, for example, setting the molding temperature to a temperature higher than the melting point of the copolymer by 50° C. to 100° C., preparing a film having a thickness of 0.25 mm under a pressure of 3 MPa, and cutting the film into pieces of 30 mm length and 5 mm width.

The copolymer may be a fluororesin.

The film of the invention, when containing the fluoropolymer or the copolymer, may further contain an additional polymer. Preferred examples of the additional polymer include: polycarbonate (PC), polyester, polyethylene terephthalate (PET), polyethylene naphthalate (PEN), silicone resin, polyether, polyvinyl acetate, polyethylene, and polypropylene (PP) for improved flexibility; polyvinylidene fluoride (PVdF), vinylidene fluoride (VdF)/hexafluoropropylene (HFP) copolymers, poly(meth)acrylate, epoxy resin, polyethylene oxide, polypropylene oxide, polyphenylene oxide (PPO), polyphenylene sulfide (PPS), polyamide (PA), polyimide (PI), polyamideimide (PAI), PC, polystyrene, and polybenzimidazole (PBI) for increased strength; and odd polyamide, cyano pullulan, and copper phthalocyanine polymers for supplementation of high dielectric properties.

Preferred among these additional polymers to be used in combination with the copolymer is at least one polymer selected from the group consisting of PVdF, VdF/HFP copolymers, poly(meth)acrylate, and polyvinyl acetate because these polymers have high affinity to the copolymer. In order to improve the mechanical strength without reducing the permittivity, PVdF and VdF/HFP copolymers are particularly preferred. In order to improve the mechanical strength and insulation resistance, poly(meth)acrylate and polyvinyl acetate are particularly preferred.

The copolymer and the additional polymer preferably give a mass ratio of 50/50 to 99/1, more preferably 75/25 to 99/1.

In order to prevent blocking of the film without reducing the mechanical strength of the film, the film of the invention may also contain silica. The amount of silica is preferably 0.01 to 10 parts by mass, more preferably 0.1 parts by mass or more and 5 parts by mass or less, still more preferably 2 parts by mass or less, relative to 100 parts by mass of the polymer.

The film of the invention may contain any of additives such as highly dielectric inorganic particles, a reinforcing filler, and an affinity improver.

Examples of the highly dielectric inorganic particles include barium titanate-based oxide particles and strontium titanate-based oxide particles. The amount of the highly dielectric inorganic particles is preferably 10 to 200 parts by mass relative to 100 parts by mass of the polymer.

While the presence of the barium titanate-based oxide particles improves the permittivity, it also increases the dielectric loss and decreases the withstand voltage. Thus, the upper limit of the amount of the barium titanate-based oxide particles is about 200 parts by mass relative to 100 parts by mass of the polymer. In addition, in order to improve the permittivity, the amount of the barium titanate-based oxide particles is preferably 10 parts by mass or more.

The presence of the strontium titanate-based oxide particles advantageously improves the permittivity and decreases the dielectric loss, but decreases the withstand voltage. Thus, it is better not to add the strontium titanate-based oxide particles when a higher withstand voltage is required.

Examples of the reinforcing filler include particles or fibers of silicon carbide, silicon nitride, magnesium oxide, potassium titanate, glass, alumina, and boron compounds.

Examples of the affinity improver include coupling agents, functional group-modified polyolefin, styrene-modified polyolefin, functional group-modified polystyrene, polyacrylate imide, and cumyl phenol. The affinity improver can be added in an amount that does not impair the effects of the invention. In terms of withstand voltage, it is better not to add these components.

The film of the invention preferably has a rate of change of −8 to +8% as calculated from a relative permittivity A at a frequency of 1 kHz and 30° C. and a relative permittivity B at a frequency of 1 kHz and 150° C. according to the following formula. The rate of change is preferably −7 to +7%, more preferably −6 to +6%. The rate of change may be −2.0% or less and +2.0% or more.

Rate of change (%)=$(B-A)/A \times 100$

The relative permittivity A and the relative permittivity B are both calculated from the formula: $C = \varepsilon \times \varepsilon_0 \times S/d$, wherein C is the capacitance measured with an LCR meter; S is the electrode area; d is the film thickness; and $\varepsilon_0$ is the permittivity of vacuum.

The film of the invention preferably has a rate of change of −8 to +8% as calculated from a relative permittivity E at a frequency of 1 kHz and 30° C. and a relative permittivity F at a frequency of 100 kHz and 30° C. according to the following formula.

Rate of change (%)=$(F-E)/E \times 100$

The relative permittivity E and the relative permittivity F are both calculated from the formula: $C = \varepsilon \times \varepsilon_0 \times S/d$, wherein C is the capacitance measured with an LCR meter; S is the electrode area; d is the film thickness; and $\varepsilon_0$ is the permittivity of vacuum.

The film of the invention preferably has a dielectric loss tangent of 7% or lower, more preferably 6% or lower, at a frequency of 1 kHz and 150° C.

The dielectric loss tangent is measured with an LCR meter.

The film of the invention preferably has an elastic modulus of 800 MPa or higher, more preferably 900 MPa or higher, in the machine direction (MD) at 25° C.

The elastic modulus can be measured in conformity with ASTM D1708.

The film of the invention may have an elastic modulus of 800 MPa or higher in the machine direction (MD) at 25° C. and a thickness of 100 μm or smaller. The elastic modulus is more preferably 900 MPa or higher. The thickness is more preferably 30 μm or smaller, still more preferably 10 μm or smaller, while preferably 1 μm or greater.

The film of the invention can suitably be produced by a production method including melt extruding a polymer to provide a film and stretching the film to provide a stretched film.

The melt extrusion may be performed at 250° C. to 380° C.

The melt extrusion may be performed using a melt extruder. The cylinder temperature is preferably 250° C. to 350° C. and the die temperature is preferably 300° C. to 380° C. Also, preferably, the molding temperature may be increased stepwise. For example, the stepwise increase of the molding temperature may preferably be such that the temperature of the cylinder portion is first set to 300° C., then increased up to 330° C., while the temperature of the T die portion is set to 340° C.

Preferably, the production method may also include winding the film obtained by the extrusion on a roll. The roll temperature is preferably 0° C. to 180° C.

The film obtained by the extrusion is stretched to provide a stretched film.

The stretching may be biaxial stretching.

The biaxial stretching stretches the film in the machine direction (MD) and the transverse direction (TD) perpendicular thereto.

The stretch ratio in the biaxial stretching is preferably 2 to 10 times, more preferably 3 times or more, still more preferably 3.5 times or more, particularly preferably 4 times or more, for each of MD and TD.

The stretching temperature in the biaxial stretching is preferably 0° C. to 200° C., more preferably 40° C. or higher and 120° C. or lower.

The stretching speed in the biaxial stretching is preferably 1E+2% to 1E+5%/min.

The biaxial stretching may be simultaneous biaxial stretching.

The biaxial stretching may be tenter biaxial stretching or tubular biaxial stretching, for example, and tenter biaxial stretching is preferred.

The stretching temperature in the biaxial stretching is preferably 0° C. to 200° C., more preferably 40° C. or higher and 120° C. or lower.

The stretching speed in the simultaneous biaxial stretching is preferably 1E+2% to 1E+5%/min.

The simultaneous biaxial stretching is a method in which the ends (in TD) of a rolled film are held by clips, and the distance between the clips is increased in both MD and TD so that the film is stretched.

The stretching may be performed using either a batch or continuous stretching machine. The stretching may directly follow the film formation performed by melt extrusion.

The production method may also preferably include heat setting the stretched film obtained. The heat setting can reduce shrinkage of the film due to factors such as heat, and can improve the durability.

The heat-setting temperature is preferably 100° C. to 250° C., more preferably 150° C. or higher and 200° C. or lower. The heat-setting duration may be short, and may be 5 minutes or shorter in continuous stretching.

The film of the invention is suitable as a highly dielectric film or a piezoelectric film.

In the case of using the film of the invention as a piezoelectric film, the film is preferably subjected to a polarization treatment. The polarization treatment may be performed by corona discharge, for example, by applying voltage to the film using a linear electrode or a needle electrode as described in JP 2011-181748 A. The polarization treatment may be followed by heat treatment.

The film of the invention can also be suitably used in a film capacitor, an electrowetting device, or a piezoelectric panel.

The film of the invention can be suitably used as a highly dielectric film of a film capacitor. The film capacitor may include the film of the invention and an electrode layer provided on at least one side of the film.

Examples of the structure of a film capacitor include: laminated structures in which electrode layers and highly dielectric films are alternately stacked (for example, those disclosed in JP S63-181411 A and JP H03-18113 A); and rolled structures in which a tape-shaped highly dielectric film and a tape-shaped electrode layer are rolled up together (for example, one disclosed in JP S60-262414 A in which electrodes are not continuously stacked on a highly dielectric film, and one disclosed in JP H03-286514 A in which electrodes are continuously stacked on a highly dielectric film). For rolled film capacitors in which electrodes are continuously stacked on a highly dielectric film, which are relatively easily producible and have a simple structure, generally, two highly dielectric films each having an electrode stacked on one side thereof are rolled up together such that the electrodes do not contact each other, and then these films are fixed as appropriate so as not to be loosened, whereby a rolled film capacitor is produced.

The electrode layer may be any layer, and is usually a conductive metal layer made of aluminum, zinc, gold, platinum, copper, or the like. It is used in the form of metal foil or a deposited metal film. Metal foil or a deposited metal film may be used alone or both may be used in combination. Usually, a deposited metal film is preferred because a thin electrode layer can be obtained with a higher capacity for its volume, excellent adhesion to a dielectric film, and a small variation in thickness. A deposited metal film is not limited to a single layer, and it may be a multi-layer, if necessary, which can be obtained by, for example, a method in which a semi-conductive aluminum oxide layer is formed on an aluminum layer so as to give moisture resistance, thereby producing an electrode layer (for example, JP H02-250306 A). The thickness of the deposited metal film is also not limited, and is preferably 100 to 2000 angstrom, more preferably 200 to 1000 angstrom. The deposited metal film having a thickness within this range is suitable because the capacity and strength of the capacitor are balanced.

When a deposited metal film is used as an electrode layer, the film may be formed by any method, such as vacuum deposition, sputtering, or ion plating. Usually, vacuum deposition is used.

There are several types of vacuum deposition, such as batch type for molded articles, and semi-continuous type and continuous (air to air) type for long-size articles. Currently, semi-continuous vacuum deposition is the mainstream. The semi-continuous metal deposition is a method in which a metal is deposited and coiled in a vacuum system which is then brought back to atmospheric pressure, and the deposited film is taken out.

The semi-continuous metal deposition may be performed specifically by the method described with reference to FIG. 1 in JP 3664342 B.

In the case of forming a thin metal layer on the film, the film surface may be subjected to a pretreatment such as corona treatment or plasma treatment so as to improve the adhesion. In the case of using metal foil as an electrode layer, the thickness of the metal foil is, although not limited, usually 0.1 to 100 μm, preferably 1 to 50 μm, more preferably 3 to 15 μm.

The fixing may be performed by any method. For example, a resin may be used to seal the structure or an insulation case may be used to encapsulate the structure, so that the structure can be fixed and protected at the same time. Also, a lead wire may be connected by any method, such as welding, ultrasonic pressure welding, thermal pressure welding, or fixing with adhesive tape. The lead wire may be connected to an electrode before rolling up. For example, in the case of encapsulation in an insulation case, if necessary, an opening may be sealed with a thermosetting resin such as urethane resin or epoxy resin to prevent oxidative degradation.

Without corona treatment or plasma treatment, the surface tension is 24 mJ/m$^2$. In this case, spread of the deposition is insufficient. Corona treatment can increase the surface tension up to about 26 to 40 mJ/m$^2$ and can provide a good deposition state. Plasma treatment can also provide equivalent processing. Still, the processing conditions thereof are stringent and the resulting surface state is poor under conditions where the surface tension exceeds 40 mJ/m$^2$, which means the process is inappropriate.

For the deposition, a fuse pattern may be integrated so as to protect a device from breakage due to film defects and to improve the reliability. Some structures of the fuse pattern can minimize a reduction in capacitance due to breakage.

The film deposited is slit into strips with a width required for a capacitor, usually a width of about 20 mm to 150 mm, using a slitter.

Thermal spray of metal such as zinc (Zn) on both end faces of rolled element can provide a metallikon electrode. The element is dried at a high temperature and a reduced pressure (120° C., Torr, 24 hours) using a vacuum oven, and then leads or terminals are soldered or welded thereto. Thereafter, the element is put into a resin case or a metal case, and the case is sealed by the following fixing method.

The film of the invention can be suitably used as a highly dielectric film of an electrowetting device.

The electrowetting device may include a first electrode, a second electrode, a conductive liquid movably contained between the first electrode and the second electrode, and the film (highly dielectric film) of the invention between the first electrode and the conductive liquid so as to insulate the first electrode from the second electrode. The film of the invention may have a water-repellent layer thereon. In addition to the conductive liquid, an insulating liquid may be held between the first electrode and the second electrode, and the conductive liquid and the insulating liquid may together form a bi-layer.

The electrowetting device may be used in optical elements, display devices (displays), varifocal lenses, light modulating devices, optical pickup devices, optical recording/reproducing devices, developing devices, droplet dispensers, and analytical instruments (such as chemical, biochemical, and biological analytical instruments which require movement of a small amount of conductive liquid to analyze samples).

The film of the invention can be suitably used as a piezoelectric film of a piezoelectric panel.

The piezoelectric panel may include a first electrode, the film (piezoelectric film) of the invention, and a second electrode in the stated order. The first electrode is directly or indirectly disposed on one of the main surfaces of the film. The second electrode is directly or indirectly disposed on the other main surface of the film.

The piezoelectric panel may be used in touch screens. A touch screen can be used in input devices. An input device including the touch screen allows data to be input based on the touch position and/or touch pressure. The input device including the touch screen can include a position sensor and a pressure sensor.

The input device may be used in electronic devices (such as mobile phones (e.g., smartphones), personal digital assistants (PDAs), tablet personal computers (PCs), ATMs, automatic ticket vending machines, and automotive navigation systems). An electronic device including the input device can be handled and operated based on the touch position and/or touch pressure.

In addition, the film of the invention can also be used as a film for environmental power generation (such as vibration power generation) or for ferroelectric devices (such as touch sensors, touch screens, tactile sensors, dielectric bolometers, film speakers, and haptics), and electrostrictive actuators.

EXAMPLES

The invention is described below with reference to examples, but the invention is not limited to these examples.

The parameters in the examples were determined by the following methods.

Monomer Composition of Fluoropolymer

The monomer composition was determined by $^{19}$F-NMR at a measurement temperature set to (melting point of the polymer+20)° C. using a nuclear magnetic resonance device. Elemental analyses were appropriately combined for measurement, depending on the integral value of each peak and the type of the monomers.

Melting Point

The melting point was determined from the peak on an endothermic curve obtained by thermal analysis at a temperature-increasing rate of 10° C./min using a differential scanning calorimeter in conformity with ASTM D-4591.

Melt Flow Rate (MFR)

The MFR was defined as the mass (g/10 min) of a polymer that flows out of a nozzle (inner diameter: 2 mm, length: 8 mm) per 10 minutes at 297° C. and a 5-kg load in conformity with ASTM D3307-01.

Film Thickness

The thickness of the film placed on a substrate was measured at room temperature using a digital thickness meter.

Crystallinity

A plurality of the films was mounted so as to give a thickness of 40 μm or greater, and this stack is mounted on a sample holder to prepare a test sample. The sample was analyzed within the range of 10° to 40° using an X-ray diffractometer, so that a diffraction spectrum was obtained. The crystallinity was calculated from the area ratio of the crystal portions and the amorphous portions in the diffraction spectrum.

Half Width

The peak in the spectrum obtained with the X-ray diffractometer was resolved into the crystal peak and the amorphous halo by peak separation. With the height from the background of the resulting crystal peak to the peak top defined as h, the half width was determined from the width of the crystal peak at the portion corresponding to h/2.

Relative Permittivity

Aluminum was deposited on both sides of the film in vacuo to prepare a sample. The capacitance of the sample was measured at a frequency of 1 kHz and 30° C. using an LCR meter. The relative permittivity was calculated from the measured capacitance.

Volume Resistivity

First, aluminum was deposited on one surface of the film in vacuo to prepare a sample. Next, this sample was placed in a constant temperature chamber (30° C., 25% RH) and a voltage of 50 V/μm was applied to the sample using a digital super megohmmeter/microammeter, whereby the volume resistivity (Ω·cm) was measured.

Breakdown Strength The film was placed on a lower electrode and a 500-g weight having a diameter of 25 mm was placed thereon as an upper electrode. A voltage applied between the ends was increased at a rate of 100 V/sec, and the voltage at break was measured. The number of measurement operations was 50. The measured values of the respective operations, excluding the five highest values and the five lowest values, were averaged. This average was divided by the thickness, whereby the breakdown voltage was obtained.

Example 1

Pelletized resin was extruded at 250° C. in a melt extruder into a film having a thickness of 50 μm. The film was simultaneously stretched to 3.0 times in MD and 3.0 times in TD using a batch-type biaxial stretching device, whereby a stretched film was obtained.

Example 2

Pelletized resin was extruded at 250° C. in a melt extruder into a film having a thickness of 50 μm. The film was simultaneously stretched to 3.5 times in MD and 3.5 times in TD using a batch-type biaxial stretching device, whereby a stretched film was obtained.

Example 3

Pelletized resin was extruded at 250° C. in a melt extruder into a film having a thickness of 50 μm. The film was simultaneously stretched to 4.0 times in MD and 4.0 times in TD using a batch-type biaxial stretching device, whereby a stretched film was obtained.

Example 4

Pelletized resin was extruded at 250° C. in a melt extruder into a film having a thickness of 50 μm. The film was simultaneously stretched to 4.0 times in MD and 4.0 times in TD using a batch-type biaxial stretching device, and then heat set for three minutes in a 160° C. atmosphere, whereby a stretched film was obtained.

Example 5

Pelletized resin was extruded at 250° C. in a melt extruder into a film having a thickness of 50 μm. The film was simultaneously stretched to 4.5 times in MD and 4.5 times in TD using a batch-type biaxial stretching device, whereby a stretched film was obtained.

Comparative Example 1

Pelletized resin was melt-pressed at 250° C., whereby a film having a thickness of 100 μm was obtained.

Comparative Example 2

Pelletized resin was extruded with a melt extruder at 250° C., whereby a film having a thickness of 50 μm was obtained.

Comparative Example 3

A vinylidene fluoride homopolymer was extruded with a melt extruder, whereby a film having a thickness of 25 μm was obtained.

The properties of the respective pelletized resins and the results are shown in Table 1. The measurement results of the volume resistivity at 30° C. and 120° C. of Example 4 and Comparative Example 2, and the electric field dependency thereof are shown in Table 2.

TABLE 1

| | Examples | | | | | Comparative Examples | | |
|---|---|---|---|---|---|---|---|---|
| | 1 | 2 | 3 | 4 | 5 | 1 | 2 | 3 |
| Resin properties Composition (mol %) | | | | | | | | |
| VDF | 40 | 40 | 40 | 40 | 40 | 40 | 40 | 100 |
| TFE | 60 | 60 | 60 | 60 | 60 | 60 | 60 | — |
| Melting point (° C.) | 213 | 213 | 213 | 213 | 213 | 213 | 213 | 177 |
| MFR (g/10 min) | 2.8 | 2.8 | 2.8 | 2.8 | 2.8 | 2.8 | 2.8 | 1.5 |
| Thickness (μm) | 9 | 8 | 7 | 4 | 3.5 | 100 | 50 | 25 |
| Production method | Melt extrusion | Melt extrusion | Melt extrusion | Melt extrusion | Melt extrusion | Melt press | Melt extrusion | Melt extrusion |
| Stretch ratio | 3.0 × 3.0 (Simultaneous) | 3.5 × 3.5 (Simultaneous) | 4.0 × 4.0 (Simultaneous) | 4.0 × 4.0 (Simultaneous) | 4.5 × 4.5 (Simultaneous) | Absent | Absent | Absent |
| Heat setting | Absent | Absent | Absent | Present | Absent | Absent | Absent | Absent |
| Crystal structure | | | | | | | | |
| Crystallinity (%) | 60 | 63 | 87 | 89 | 90 | 49 | 38 | 51 |
| Half width | 0.7 | 0.7 | 0.8 | 1.3 | 0.8 | 1.3 | 0.9 | 1.3 |
| Film properties | | | | | | | | |
| Relative permittivity (1 kHz, 30° C.) | 11 | 11 | 11 | 12 | 12 | 8.2 | 10 | 11 |
| Volume resistivity (Ω · cm) | 9E+15 | 2E+16 | 3E+16 | 3E+16 | 4E+16 | 2E+14 | 9E+14 | 8E+13 |
| Breakdown strength (V/μm (AVE)) | 549 | 560 | 580 | 581 | 652 | 415 | 420 | 418 |

TABLE 2

| | | Measurement temperature | | | |
|---|---|---|---|---|---|
| | | 30° C. | 120° C. | | |
| | | Electric field | | | |
| | | 50 V/μm | 50 V/μm | 100 V/μm | 200 V/μm |
| Volume resistivity Ω·cm | Example 4 | 3E+16 | 1E+14 | 1E+14 | 1E+14 |
| | Comparative Example 2 | 9E+14 | 8E+12 | 6E+12 | 1E+12 |

The invention claimed is:

1. A film having:
   a relative permittivity of 9 or higher at a frequency of 1 kHz and 30° C.;
   a volume resistivity of 5E+15 Ω·cm or higher at 30° C.; and
   a breakdown strength of 500 V/μm or higher,
   wherein the film comprises a fluoropolymer including vinylidene fluoride (VDF) units and tetrafluoroethylene (TFE) units in a VDF/TFE mole ratio of 10/90 to 49/51, and
   wherein the film is obtained by stretching.

2. The film according to claim 1,
   wherein the film has a crystallinity of 60% or higher.

3. The film according to claim 1,
   wherein the film has a half width of a crystal peak of 0.5 to 1.5 in X-ray diffraction.

4. The film according to claim 1,
   wherein the fluoropolymer has a melting point of 180° C. or higher.

5. The film according to claim 1,
   wherein the film has a thickness of 1 to 100 μm.

6. The film according to claim 1,
   wherein the film is a dielectric film or a piezoelectric film.

7. The film according to claim 1,
   wherein the film is intended to be used in a film capacitor, an electrowetting device, or a piezoelectric panel.

* * * * *